(12) United States Patent
Scott et al.

(10) Patent No.: US 11,124,608 B2
(45) Date of Patent: Sep. 21, 2021

(54) POLYBENZOXAZINE RESINS WITH HIGH HYDROGEN CONTENT, AND COMPOSITES THEREFROM

(71) Applicants: CASE WESTERN RESERVE UNIVERSITY, Cleveland, OH (US); MATERIAL ANSWERS LLC, Weston, MA (US)

(72) Inventors: Christopher E. Scott, Weston, MA (US); Hatsuo Ishida, Shaker Heights, OH (US); Scott Allen Winroth, Ayer, MA (US)

(73) Assignees: CASE WESTERN RESERVE UNIVERSITY, Cleveland, OH (US); MATERIAL ANSWERS LLC, Weston, MA (US)

( * ) Notice: Subject to any disclaimer, the term of this patent is extended or adjusted under 35 U.S.C. 154(b) by 5 days.

(21) Appl. No.: 16/375,415

(22) Filed: Apr. 4, 2019

(65) Prior Publication Data

US 2019/0309129 A1    Oct. 10, 2019

Related U.S. Application Data

(60) Provisional application No. 62/652,675, filed on Apr. 4, 2018.

(51) Int. Cl.

| | |
|---|---|
| *H05K 9/00* | (2006.01) |
| *C08G 73/02* | (2006.01) |
| *C08L 79/02* | (2006.01) |
| *C08L 23/06* | (2006.01) |
| *C08J 5/24* | (2006.01) |

(52) U.S. Cl.
CPC ............ *C08G 73/0273* (2013.01); *C08J 5/24* (2013.01); *C08L 23/06* (2013.01); *C08L 79/02* (2013.01); *H05K 9/009* (2013.01); *C08J 2379/02* (2013.01); *C08J 2423/06* (2013.01); *C08L 2205/16* (2013.01); *C08L 2207/062* (2013.01); *C08L 2207/068* (2013.01)

(58) Field of Classification Search
CPC ....... B01J 19/06; B29C 39/003; C09J 179/02; C08G 14/073; C08G 59/027
USPC ................... 428/114, 704; 508/246; 525/523
See application file for complete search history.

(56) References Cited

U.S. PATENT DOCUMENTS

| | | |
|---|---|---|
| 7,855,157 B1 | 12/2010 | Kaul et al. |
| 9,120,763 B2 | 9/2015 | Wang et al. |
| 2007/0191555 A1* | 8/2007 | Ishida .................. C08G 59/027 525/523 |

(Continued)

FOREIGN PATENT DOCUMENTS

| | | | |
|---|---|---|---|
| CN | 107400332 A | 11/2017 | |
| JP | 2008-195907 A | * 8/2008 | ........... C08G 14/073 |

*Primary Examiner* — Khanh T Nguyen
(74) *Attorney, Agent, or Firm* — Hudak, Shunk & Farine Co. LPA

(57) ABSTRACT

A material with significant protection properties from galactic cosmic radiation and solar energetic particles. Hydrogen-rich benzoxazines which are particularly effective for shielding against such radiation. Benzoxazine resin meets the processing requirements for use with ultra-high molecular weight polyethylene fiber as a hydrogen-rich reinforcement: cure of the resin at 120° C. This highly reactive benzoxazine resin also exhibits low viscosity and adequate shelf life.

28 Claims, 5 Drawing Sheets

(56) References Cited

U.S. PATENT DOCUMENTS

| | | | |
|---|---|---|---|
| 2009/0137434 A1* | 5/2009 | Kurihara | C09J 179/02 |
| | | | 508/246 |
| 2014/0011052 A1* | 1/2014 | Gorodisher | B01J 19/06 |
| | | | 428/704 |
| 2016/0185908 A1* | 6/2016 | Harriman | B29C 39/003 |
| | | | 428/114 |
| 2018/0030264 A1 | 2/2018 | Wang et al. | |
| 2018/0037342 A1 | 2/2018 | Dong et al. | |

* cited by examiner

POLYBENZOXAZINE RESINS WITH HIGH HYDROGEN CONTENT, AND COMPOSITES THEREFROM

GOVERNMENT LICENSE RIGHTS

This invention was made with Government support under contract NNX15CL03C awarded by NASA. The Government has certain rights in the invention.

FIELD OF THE INVENTION

The present invention is in the technical field of polymer compositions. More particularly, the present invention relates to benzoxazine compositions, composites therefrom, and their preparation.

BACKGROUND OF THE INVENTION

Polybenzoxazines are a class of thermosetting polymers that belong to the family of addition-curable phenolic resins. One type of benzoxazine includes monomers synthesized from different phenols and amines of varying backbone structures. Polybenzoxazines have gained interest because of their unique thermal and mechanical properties and their flexible synthesis chemistry that allows for compounds tailored to specific applications. The unique properties of polybenzoxazines originate from their hydrogen-bonded structures. Polymerization of benzoxazines can be achieved through the cationic ring opening of the oxazine ring, with or without an added initiator or catalyst. Another unique characteristic is that polybenzoxazines have greater molecular design flexibility than other polymers. They release no reaction by-product during polymerization, and no strong acid or alkaline catalysts are required for the synthesis of monomers or polymerization. However, some acids, such a phenols and carboxylic acids, will accelerate the rate of polymerization. Furthermore, no volatiles are released and almost no shrinkage is experienced upon polymerization.

There is a need in space and aerospace applications for shielding against radiation, including galactic cosmic radiation (GCR) and solar energetic particles (SEP). Such shielding is most effectively accomplished with materials that have a high content of hydrogen nuclei. For example, sheets of high density polyethylene (HDPE) may be used for this shielding; however, the mechanical properties of HDPE are insufficient for structural or semi-structural applications. There is a long-standing need for multifunctional materials that possess high hydrogen content and superior mechanical properties so that components comprised of these materials can provide both shielding and structural functionality. In particular, there is a need for materials with high hydrogen content that provide excellent radiation shielding capabilities as well as high strength, stiffness, and toughness.

Outer space is filled with high-energy ionizing radiation that bombards objects in its path. It is widely recognized that GCR and SEP are threats to a sustained human presence beyond the earth's magnetosphere. GCR is composed mostly of protons (~85%), helium ions (~12%), and a small fraction that includes nuclei of numerous elements and some electrons. Helium ions are also known as alpha particles or alpha radiation. SEP is composed mostly of protons, electrons, and higher atomic weight nuclei. Periodic solar particle events contribute to this radiation. During these events a large number of mainly high-energy protons are produced. These events may last from hours to several days.

Like other ionizing radiation, GCR and SEP can damage DNA, increasing the risk of a variety of health problems. The health threat of the radiation depends on the flux, energy spectrum, and nuclear composition of the radiation. A key implication of the GCR and SEP problem for human exploration and development of space is that considerable mass for radiation shielding often must be added to spacecraft, vehicles, and habitats.

There is a need in space and aerospace applications to minimize the weight and volume of spacecraft, vehicles, and habitats. High costs are associated with launches into space, especially heavy and/or large payloads. High costs arise from the necessity that spacecraft, vehicles, and habitats have separate components to function as radiation shields and structural elements.

Thus, there is a need for effective radiation shielding with minimal addition of weight to spacecraft through multifunctional component capabilities. In particular, it would be desirable to incorporate materials with radiation shielding characteristics into high performance components with mechanical properties suitable for structural applications. It would be most desirable to utilize shielding materials that also have high strength-to-weight and high modulus-to-weight ratios.

Composites with continuous fiber reinforcement are one type of material that can achieve high strength, high modulus, high strength-to-weight ratio and high modulus-to-weight ratio. For shielding against GCR and SEP, it would be advantageous to utilize continuous polyethylene fibers for reinforcement due to their high hydrogen content. However, when fabricating composites using these fibers it is imperative that the processing conditions do not exceed the fibers' short-duration temperature threshold (typically 130° C.). Exceeding this threshold causes disruption of the polyethylene crystalline structure and results in a variety of concomitant detrimental effects. Higher temperatures may cause the fibers to melt. Disruption of the crystalline structure or melting of the fibers dramatically reduces their mechanical properties. Many thermosetting polymer resins must be polymerized at temperatures much higher than 130° C. Typically, polybenzoxazine resins are polymerized in the temperature range of 160° C. to 220° C., well above the short-duration threshold of polyethylene fibers. There is a need for resins with high hydrogen content that can be polymerized in the bulk at low temperatures, 130° C. or lower, so that composites with high hydrogen content including polyethylene fiber reinforcement can be prepared without detrimental effects to the fibers.

The shelf life of a resin is important to its technical and commercial feasibility. In practice, resins are prepared and then stored and perhaps shipped prior to their cure to form a part. Adequate shelf life is required to ensure that the resin does not cure, or partially cure, during storage and/or shipping. Commercial resins are commonly refrigerated or frozen to extend their shelf life. Achievement of adequate shelf life is particularly challenging for resins that may be cured at low temperatures. The curing process is generally dependent on both time and temperature. Resins with low curing temperatures may cure slowly during storage or shipping, even if refrigerated, because of long times spent in storage or shipping. There is a need for resins with high hydrogen content that have low cure temperatures and long shelf life.

The viscosity of a resin is an important attribute with respect to its processability. Generally, resins with lower viscosities are easier to process and are amenable to processing by a wider variety of methods compared to resins with high viscosities. Low resin viscosity is especially desirable for manufacturing of composites with continuous fiber reinforcements because the low viscosity aids in impregnation, infiltration, and wet-out of the fibers.

U.S. Pat. No. 7,855,157 discloses a composite radiation shielding material that is described as being multifunctional and providing structural attributes, micro-meteoroid and orbital debris (MMOD) protection attributes, and radiation shielding attributes. The multifunctional material is described as comprising three layers including an outermost layer comprised of a ceramic material for MMOD protection. Aluminum oxide, boron carbide, and silicon carbide are listed as candidate materials for this layer. The middle layer is comprised of approximately 68 percent by volume ultra-high molecular weight polyethylene (UHMWPE) fibers and approximately 32 percent by volume polyethylene matrix. This layer is identified as providing MMOD protection and radiation shielding attributes. The innermost layer is comprised of 30 to 42 percent by volume UHMWPE fiber, 18 to 30 percent by volume graphite fiber, and the remaining percent by volume epoxy resin matrix. This layer is identified as providing both structural attributes and radiation shielding attributes. The use of alternative matrix materials, including benzoxazines, is not considered. Furthermore, the '157 patent does not teach methods for preparation of composites comprising polyethylene fibers and a polymer matrix. In particular, the use of alternative matrix materials with cure temperatures below the short duration temperature threshold of UHMWPE fiber is not considered.

U.S. Patent Application Publication 2018/0037342 discloses a multifunctional composite structure containing two or more layers of composite panels that reportedly provide radiation shielding attributes, structural attributes, and MMOD protection. Composite panels are constructed of composite materials selected from the following group: "Kevlar 49, fiberglass, boron carbide, Spectra Fiber, Nextel fabric, graphite/epoxy fabric, spectra fiber/high density polyethylene (HDPE), graphite/epoxy tape, or other equivalent materials or combinations of equivalent materials such as graphite/spectra/high density polyethylene laminate." The use of different combinations of these materials in different layers is considered. The hydrogen content of the materials is given consideration and used to create a material index where a larger number indicates higher hydrogen content and thus better radiation protection. However, the use of alternative matrix materials, including benzoxazines, is not considered. Furthermore, the '342 publication does not teach methods for preparation of composites comprising polyethylene fibers and a polymer matrix. In particular, the use of alternative matrix materials with cure temperatures below the short duration temperature threshold of UHMWPE fiber is not considered.

Chinese Patent Application Publication CN107400332 discloses a composite radiation shielding material comprised of phthalonitrile benzoxazine resin and metal boride reinforcing particles. The material is described as providing structural attributes in addition to radiation shielding attributes. Multiple benzoxazine formulations are considered, including those containing a diamine as the primary amine ingredient. The primary diamine considered is diaminodiphenylmethane. Aliphatic diamines, including 1,12-diaminododecane, are not considered. Monofunctional phenol ingredients are considered; however, none are considered that contain an alkoxy group such as 3-butoxy. Reinforcement with continuous fiber, including polyethylene fiber, is not considered.

U.S. Pat. No. 9,120,763 discloses benzoxazine resins and methods for producing benzoxazine resins containing monofunctional phenols or bifunctional phenols in combination with monofunctional amines and difunctional amines. Numerous monofunctional phenols are listed in the disclosure, including phenol, o-cresol, p-cresol, m-cresol, p-tert-butylphenol, p-octylphenol, o-phenylphenol, p-phenylphenol, m-methoxyphenol, p-methoxyphenol, and m-ethoxyphenol, among others. Numerous difunctional amines are listed in the patent disclosure, including o-phenylene diamine, m-phenylene diamine, p-phenylene diamine, 1,2-diaminoethane, 1,3-diaminoethane, 1,3-diaminopropane, 1,4-diaminobutane, 1,6-diaminohexane, 1,10-diaminodecane, 1,12-diaminododecane, 1,14-diaminotetradecane, and 1,18-diaminooctadecane, among others. The '763 patent does not discuss cure conditions for the benzoxazine resins.

U.S. Patent Application Publication 2018/0030264 entitled "Benzoxazine Low Temperature Curable Composition" discloses benzoxazine compositions that may be cured " . . . at temperatures as low as 130-140° C." Numerous monofunctional phenols are listed in the disclosure, including phenol, cresol, t-butyl phenol, dimethyphenol and trimethylphenol, among others. Numerous difunctional amines are listed in the disclosure, including o-phenylene diamine, m-phenylene diamine, p-phenylene diamine, ethylenediamine, and propylenediamine, among others. Examples #4 and #5 indicate curing processes that included curing conditions of 130° C., 145° C., and 160° C. which were described as "low cure temperature" in contrast to Comparative Example #5 which included curing conditions of 150° C. and 177° C. The cure temperatures for the formulations described in the '264 application are significantly higher than those required by the resins of the present invention. The cure temperatures for the formulations described in the '264 publication are too high for use with polyethylene fiber reinforcement.

BRIEF SUMMARY OF THE INVENTION

Embodiments of the present invention provide a variety of advantages for radiation shielding with materials also having mechanical properties suitable for structural applications. Embodiments of the invention include materials, resins, polymers, and composites with high hydrogen content that are particularly effective for shielding against radiation; including GCR and SEP radiation. Embodiments of the invention include high hydrogen content benzoxazine resins with low cure temperatures sufficient to allow the preparation of composites with polyethylene fiber reinforcement.

Embodiments of the invention include benzoxazine resins with adequate shelf life for technical and commercial feasibility. Embodiments of the invention include high hydrogen content composites with excellent mechanical properties suitable for structural and semi-structural applications. Embodiments of the invention include high hydrogen content composites that can function both as radiation shields and as structural components. Embodiments of the invention also include resins with low viscosities that provide for superior processability and ease of impregnation, infiltration and wet-out of reinforcements. Embodiments of the invention further include resins that can be used as matrices in composites with a variety of different reinforcing fibers including, for example, polyethylene fibers, carbon fibers, boron fibers, and copper fibers.

Embodiments of the present invention include a new class of benzoxazine polymers that possess a unique combination of material properties, processability, and shelf life that are superior to those of similar polymers disclosed in the prior art. Embodiments of the invention also have low cure temperatures and yet possess sufficiently long shelf life to be commercially feasible. The combination of high hydrogen content, low cure temperature, low viscosity, and adequate shelf life is particularly unique.

The benzoxazine polymers and composites of the present invention possess unique combinations of material properties, processability, and shelf life that are particularly useful in radiation shielding applications where the need to minimize weight and/or volume is critical. The molecular design of the resins provides for high hydrogen content, low temperature cure, low viscosity, and suitable resin shelf life. Exemplary benzoxazine resin embodiments are prepared from aliphatic diamines and substituted phenols. The resin may be cured with or without catalyst to form a polymer. Composites may be prepared using the benzoxazine as the matrix and a variety of reinforcements. Of particular interest are composites prepared using ultra high molecular weight polyethylene fibers or fabric as the reinforcement. The resin has a low viscosity during forming which aids in preparation and molding of the composite. The resin cures at a temperature low enough that composites may be prepared without melting or disrupting the crystallites of high density polyethylene reinforcement.

The unique and novel features of the present invention include the combination of high hydrogen content, low temperature cure, low viscosity, adequate resin shelf life, and mechanical properties. This combination of properties is not achieved by existing alternative materials for shielding applications. Aspects of the property profile of materials of the invention are superior to those of prior art polymers, polymer composites, and metals. The combination of properties opens new possibilities for the design of structures for shielding against galactic cosmic radiation and solar energetic particles.

Therefore, one aspect of the invention relates to a benzoxazine resin of the chemical structure:

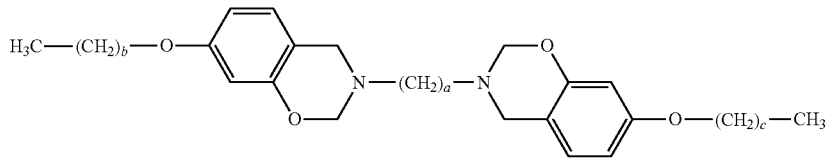

wherein $2 \leq a \leq 18$, $0 \leq b \leq 6$, and $0 \leq c \leq 6$. Polybenzoxazine is formed by polymerization of the benzoxazine. In some embodiments, the polybenzoxazine polymerization uses a cure cycle for which the maximum temperature does not exceed about 120° C. In a further aspect, a polybenzoxazine is formed by the polymerization of the benzoxazine, wherein $6 \leq a \leq 14$, $2 \leq b \leq 4$, and $2 \leq c \leq 4$, wherein the noted cure cycle is preferably utilized. In some embodiments of the benzoxazine resin, c is equal to b, and optionally $6 \leq a \leq 18$ and $1 \leq b \leq 6$. In a further aspect, polybenzoxazine is formed by cure of the benzoxazine, wherein $6 \leq a \leq 18$ and $1 \leq b \leq 6$, preferably using a cure cycle for which the maximum temperature does not exceed about 120° C. In a preferred aspect, $6 \leq a \leq 14$ and $2 \leq b \leq 4$, and optionally but preferably the polymerization utilizes a cure cycle for which the maximum temperature does not exceed about 120° C. In a highly preferred aspect of the polybenzoxazine, $a=12$ and $b=3$.

In a further aspect, a material is disclosed, comprising:
a) 1 to 99% by weight of a polybenzoxazine formed by cure of a benzoxazine resin of the chemical structure:

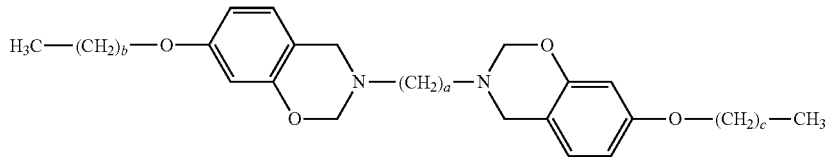

wherein 2≤a≤18, 0≤b≤6, and 0≤c≤6; and
b) 99% to 1% by weight of polyethylene. In still another aspect the polyethylene comprises one or more of a high-density polyethylene and an ultra-high molecular weight polyethylene. In another aspect 6≤a≤14, 2≤b≤4, and 2≤c≤4, or a=12 and b=c=3.

Still another aspect relates to a material, comprising:
a) 5 to 95% by volume of a polybenzoxazine formed by cure of a benzoxazine resin of the chemical structure:

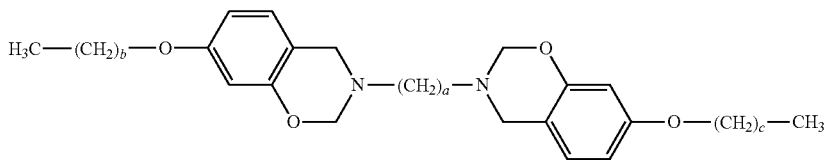

wherein 6≤a≤18, 1≤b≤6, and 1≤c≤6; and
b) 95% to 5% by volume of fibrous reinforcement. In a preferred aspect, the fibrous reinforcement comprises continuous fiber or woven continuous fiber, wherein optionally but preferably the fibrous reinforcement comprises one or more of a polyethylene fiber, carbon fiber, and boron fiber. In a further aspect 6≤a≤14, 2≤b≤4, and 2≤c≤4, or a=12 and b=c=3.

In yet another aspect, a material is disclosed, comprising:
a) 5 to 95% by volume of a polybenzoxazine formed by cure of a benzoxazine resin of the chemical structure:

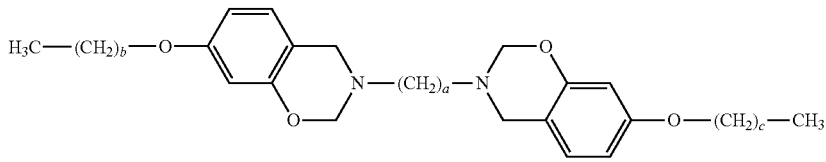

wherein 6≤a≤18, 1≤b≤6 and 1≤c≤6; and
b) 95% to 5% by volume of a fibrous electrical conductor. In one aspect the fibrous electrical conductor comprises continuous fiber or woven continuous fiber, wherein preferably the fibrous electrical conductor comprises copper. In one aspect, 6≤a≤14, 2≤b≤4 and 2≤c≤4, or a=12 and b=c=3. In an additional aspect, the material comprises a) 30% to 95% by volume of the polybenzoxazine, wherein a=12 and b=c=3, and b) 5% to 70% by volume of the fibrous reinforcement, and wherein the fibrous reinforcement is woven high density polyethylene fiber. A molded object is formed from any of the noted materials in another aspect of the invention.

BRIEF DESCRIPTION OF THE SEVERAL VIEWS OF THE DRAWING(S)

Figure 3:
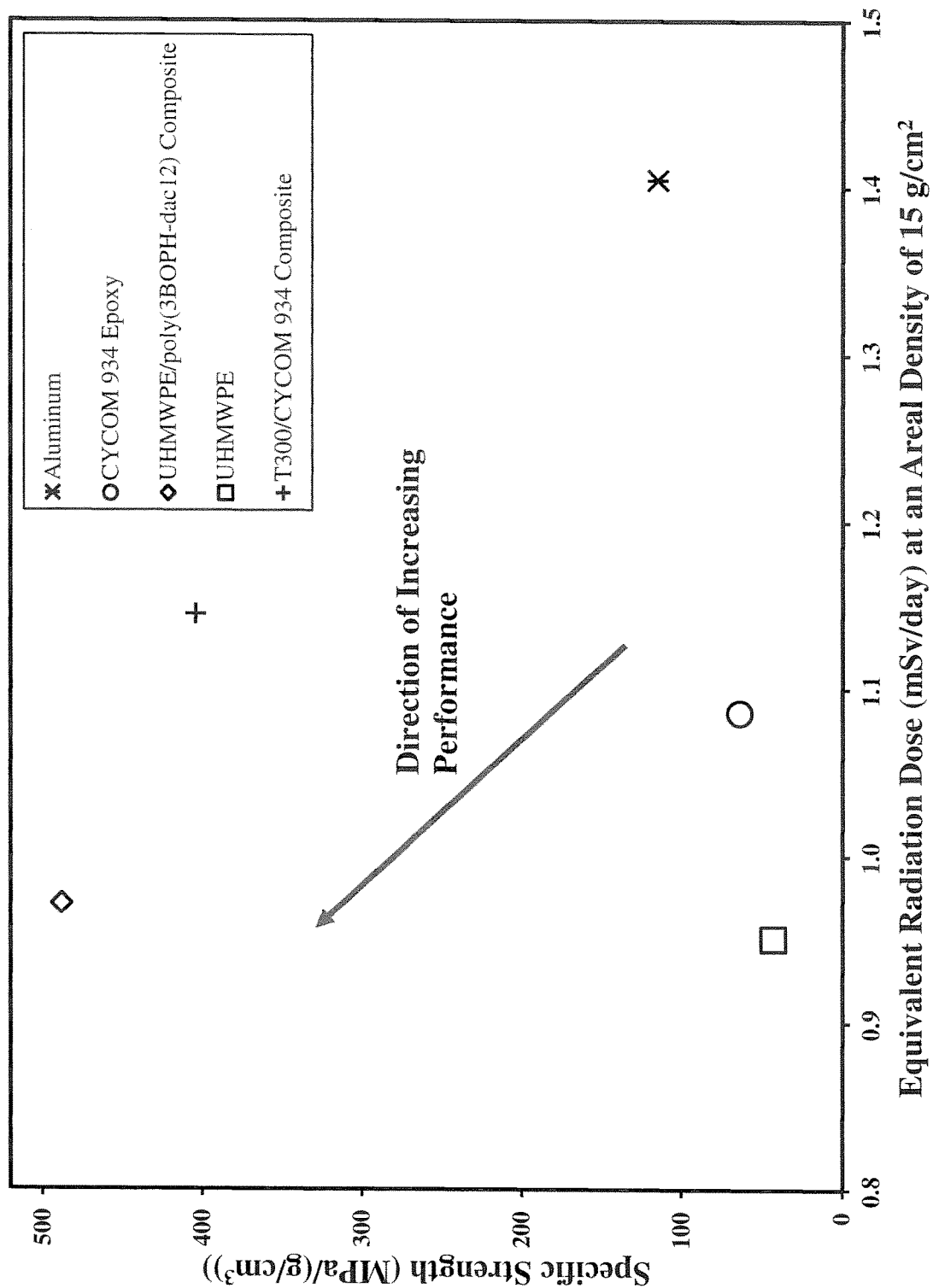

FIG. 3 is a graphical comparison of specific strength versus equivalent radiation dose for select materials. Equivalent radiation doses were calculated for materials with 15 g/cm² areal density using OLTARIS simulation software. The following parameters were used: GCR 1AU free space environment, Badhwar-O'Neill 2010 GCR model, and 1977 solar minimum event.

Figure 4:
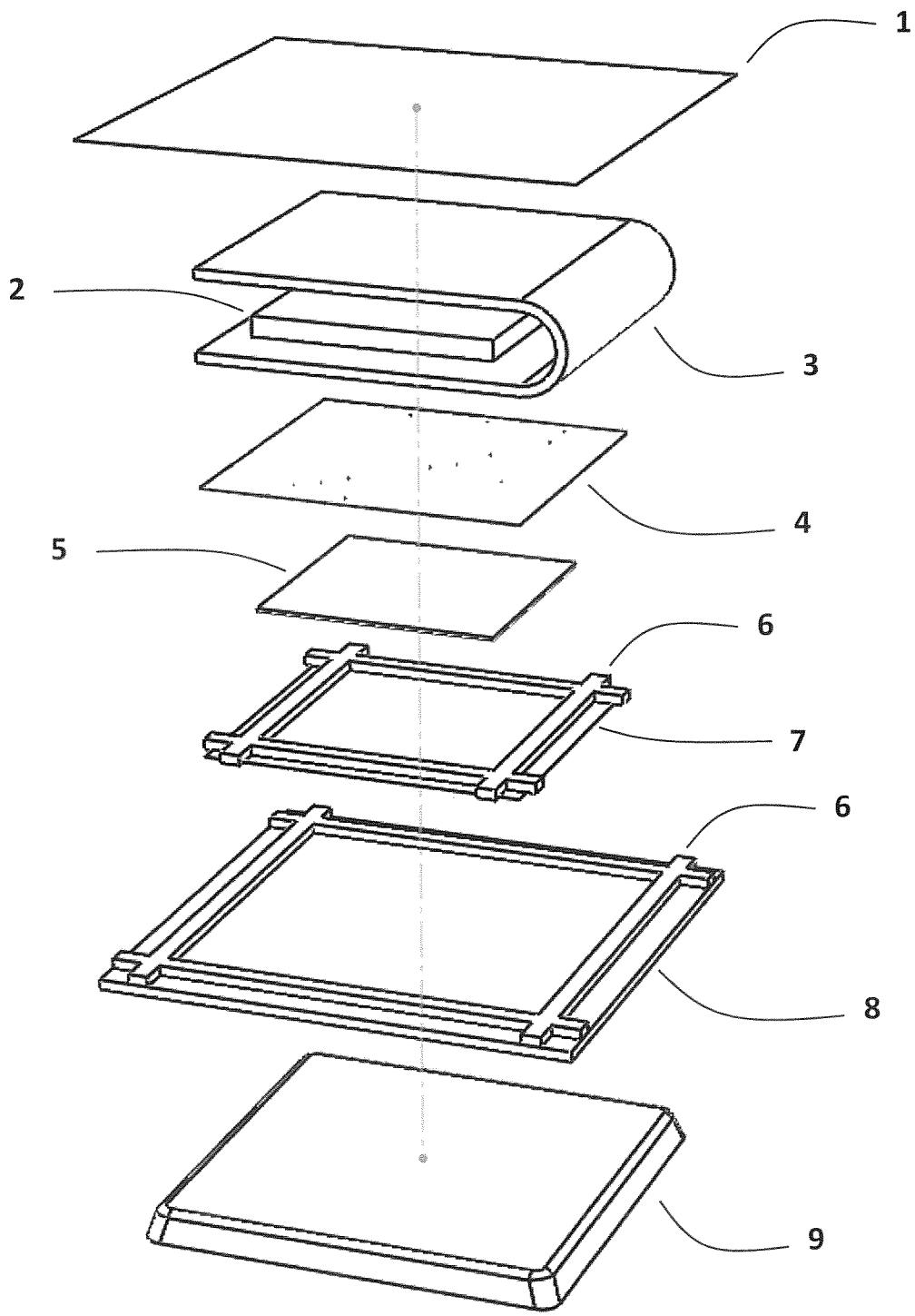

FIG. 4 is an exploded assembly drawing of the vacuum bagging setup used in Examples 4, 5 and 10.

Figure 5:
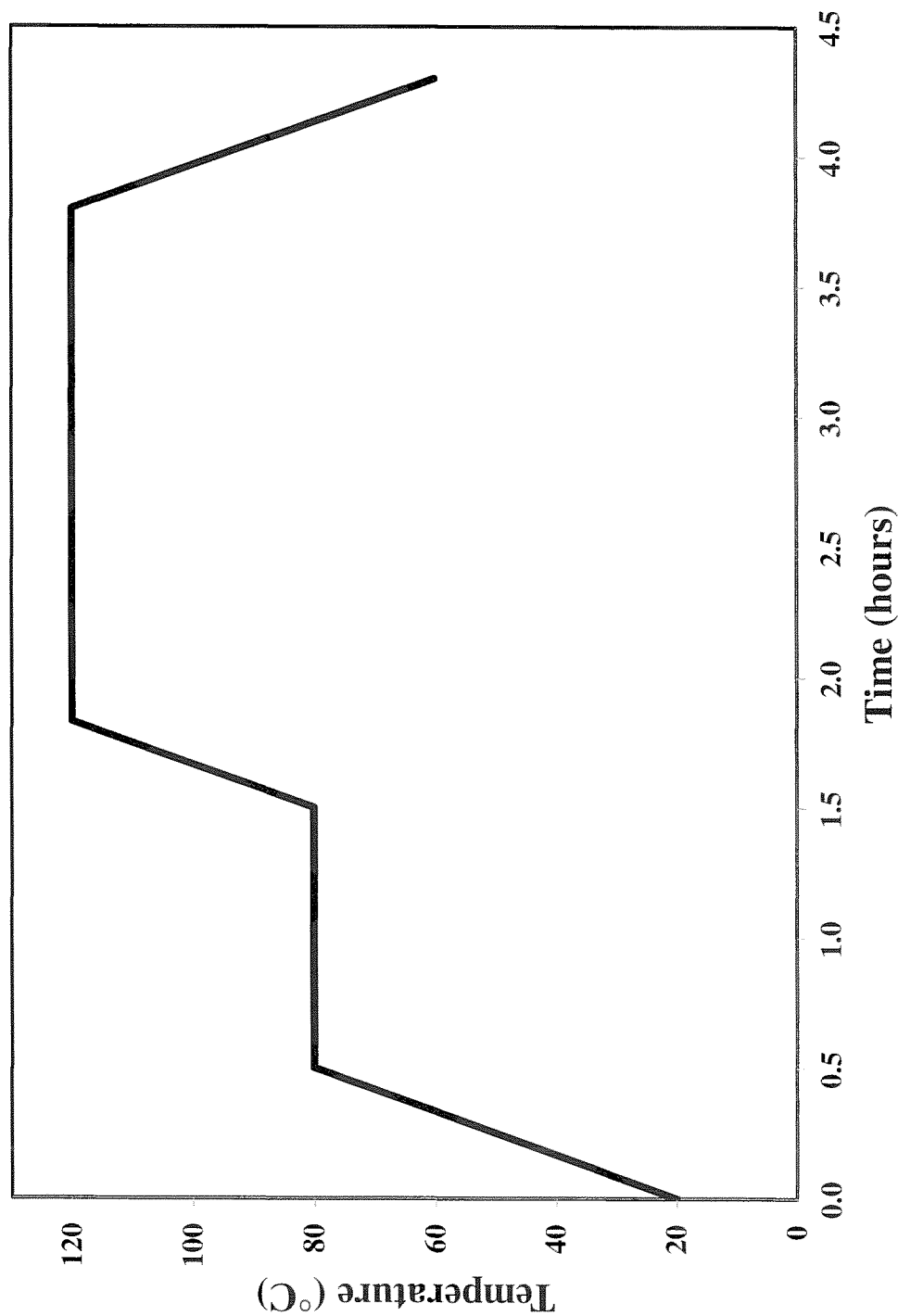

FIG. 5 is a plot of the typical cure cycle used in Examples 4, 5 and 10.

DETAILED DESCRIPTION OF THE INVENTION

Embodiments of the invention include benzoxazine resins of the molecular structure:

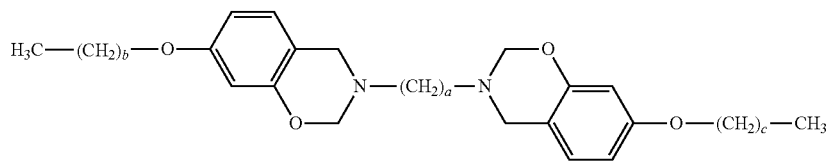

where the subscripts a, b, and c of ($CH_2$) in the structure are integers, the value of a is greater than or equal to two, and the values of b and c are greater than or equal to zero. It is understood that resins of this generic structure will have isomers with respect to the position of the alkoxy group relative to the oxygen atom in the benzoxazine ring. The specific isomer illustrated in this structure is the 7, 7' isomer. However, 5, 5' and 5, 7' isomers are also understood to be included. The resins of the invention include the various possible isomers and combinations thereof. In practice the resin molecular structure will typically include a mixture of isomers.

These resins can be prepared by methods known in the art, for example, by the reaction of a diamine with meta-substituted phenols in the presence of formaldehyde. The reaction may be accomplished in solution under reflux using a mixture of the diamine, meta-substituted phenol, and paraformaldehyde. It has been unexpectedly found that the meta-substituted phenols that are the subject of the current invention are particularly advantageous compared to para-substituted or ortho-substituted phenols. Generally, the reactive characteristics of the resins are superior for meta-substituted phenols as compared to para- or ortho-substituted phenols.

There are numerous suitable diamines that can be utilized to form benzoxaxines with corresponding structures. Suitable diamines include diamines with a in the range of 6 to 18 inclusive, such as 1,6-diaminohexane; 1,8-diaminooctane; 1,10-diaminodecane; 1,12-diaminododecane; 1,14-diaminotetradecane; 1,16-diaminohexadecane, and 1,18-diaminooctadecane. Mixtures of diamines may also be utilized. Preferably the diamine selected corresponds to a structure with a in the range of 8 to 16, inclusive. Most preferably the diamine is 1,12-diaminododecane (a=12).

There are numerous suitable meta-substituted phenols that can be utilized to form benzoxazines with corresponding structures. Suitable meta-substituted phenols include, but are not limited to, 3-methoxyphenol, 3-ethoxyphenol, 3-propoxyphenol, 3-butoxyphenol, 3-pentyloxyphenol, 3-hexyloxyphenol, and 3-heptyloxyphenol. When a single phenol is utilized b=c in the molecular structure illustrated above. Mixtures of phenols may also be utilized. Preferably a single phenol is used and the phenol structure corresponds to b (=c) in the range of 2 to 5 inclusive. Most preferably the phenol is 3-butoxyphenol (b=c=3).

One aspect of embodiments of the invention relates to the hydrogen content of the benzoxazine resins. Materials with higher hydrogen concentration are generally more effective for shielding against GCR and SEP. The hydrogen concentration of the cured resins (typically expressed in H atoms per $cm^3$) depends both on the molecular structure and the density of the cured resin. The hydrogen concentration depends on the molecular structure and increases as the $CH_2$ content—reflected by the values of a, b, and c—increase in the resin structure.

The table below compares the estimated hydrogen concentration of a number of materials. Estimated hydrogen concentration is calculated using the following equation:

$$\text{Estimated hydrogen concentration} = N_H \cdot N_{Av} \cdot \rho / M$$

where,
$N_H$ is the number of hydrogen atoms per repeat unit;
$N_{Av}$ is Avogadro's constant ($6.022 \times 10^3$ $mol^{-1}$);
$\rho$ is the average density of the material ($g/cm^3$); and
M is the molar mass of the repeat unit (g/mol).
Suitable methods for determining the average density of the material include ASTM D792 "Standard Tests Methods for Density and Specific Gravity (Relative Density) of Plastics by Displacement," ASTM D1505 "Standard Test Method for Density of Plastics by the Density-Gradient Technique," and other similar methods.

The final units for hydrogen concentration are expressed as hydrogen atoms$\times 10^{22}/cm^3$. The table includes a polymer of the present invention, poly(3OBPH-dac12), which corresponds to the polymer formed by curing the resin prepared from 1,12-diaminododecane and 3-butoxyphenol. The table also includes another polymer of the present invention, poly(3OHPH-dac16), corresponding to the cured resin prepared from 1,16-diaminohexadecane and 3-hexyloxyphenol.

| Material Type | Molecular Formula | $N_H$ | $\rho$ (g/$cm^3$) | M (g/mol) | Hydrogen Concentration (H atoms $\times$ $10^{22}/cm^3$) |
|---|---|---|---|---|---|
| Polyethylene (UHMWPE) | $CH_2$ | 2 | 0.93 | 14.03 | 7.98 |
| Poly(3OHPH-dac16) | $C_{44}H_{72}N_2O_4$ | 72 | 1.07 | 693.05 | 6.69 |
| Water | $H_2O$ | 2 | 1.00 | 18.02 | 6.68 |
| Poly(3OBPH-dac12) | $C_{36}H_{56}N_2O_4$ | 56 | 1.07 | 580.84 | 6.21 |
| Lithium Hydride | LiH | 1 | 0.78 | 7.95 | 5.91 |
| Epoxy (Cytec CYCOM® 934) | $C_{37}H_{42}N_4O_6S$ | 42 | 1.30 | 670.82 | 4.90 |
| Polyetherimide | $C_{37}H_{24}N_2O_6$ | 24 | 1.27 | 592.61 | 3.10 |

The hydrogen concentration of these polymers is comparable to other materials used or considered for use in GCR and SEP shielding. The hydrogen concentration of poly(3OBPH-dac12) is higher than that of Cytec CYCOM® 934 epoxy, which is referenced by NASA radiation shielding literature [J. W. Wilson, J. Miller, A. Konradi and F. A. Cucinotta, "Shielding Strategies for Human Space Exploration, NASA Conference Publication 3360," in Proceedings of Workshop on Shielding Strategies for Human Space Exploration, 6-8 Dec. 1995, Houston, Tex., 1997].

Therefore, in various embodiments of the invention, hydrogen concentration of a polymer of the present invention is generally greater than 5.0, desirably greater than 6.0, and preferably greater than 6.2, wherein the hydrogen concentration has units of hydrogen atoms$\times 10^{22}/cm^3$.

Another aspect of embodiments of the present invention relates to the shelf life of the benzoxazine resins prior to curing. Polymer resins must have adequate shelf life to avoid cure or partial cure during storage and/or transportation. An adequate shelf life is needed for the resin to be technically and commercially feasible. For example, the "Composite Materials Handbook, Vol. 1 (2012) defines shelf life as "The length of time a material, substance, product, or reagent can be stored under specified environmental conditions and continue to meet all applicable specification requirements and/or remain suitable for its intended function." [p. 1-51] It is common practice to refrigerate or freeze resins during storage and/or transport when needed in order to extend the shelf life. Extended shelf life can be achieved for embodiments of the present invention through use of refrigeration and/or freezing. The resin 3OBPH-dac12, which is prepared from 1,12-diaminododecane and 3-butoxyphenol, has a shelf life in excess of three months when stored at −18° C. Adequate shelf life is a major advantage over some alternative resins which have very short shelf lives (one day or a few days) or must be stored frozen while in solution rather than in bulk form.

Polymer resins in various embodiments of the invention have a shelf-life generally in excess of 15 days, desirably in excess of one month, and preferably in excess of three months when stored at −18° C.

Another aspect of embodiments of the present invention relates to the low viscosity of the resin. Low viscosity is advantageous for ease of processability. Resin embodiments of the present invention may be molded using a variety of methods known in the art including injection molding, compression molding, resin transfer molding, vacuum assisted resin transfer molding, casting, autoclaving, vacuum bagging, hand lay-up, machine lay-up, and others. Low viscosity is particularly advantageous for molding of continuous fiber composites because it allows for ease of impregnation, infiltration, and/or wet-out of the fibers. The exemplary resin embodiment 3OBPH-dac12 can be easily incorporated into composites with fabric reinforcements through hand lay-up or machine lay-up due to its low viscosity at room temperature. The low viscosity also allows the composites to be consolidated and cured using vacuum bagging rather than requiring costly high-pressure molding equipment such as a compression molding machine or autoclave. For example, the shear viscosity of the resin described in Example 1 below was measured and found to be approximately 1 Pa-s (1000 cP) at 120° C. This low viscosity allows it to be processed more easily with a wide range of processing methods (in contrast to higher viscosity resins that are more difficult to process and may not be processed by some methods that require low viscosity). Numerous exemplary composite embodiments of about 60% by volume ultra high molecular weight polyethylene (UHMWPE) fibers and 40% by volume poly(3OBPH-dac12) have been prepared in the form of plates with thicknesses ranging from 0.06 inch (1.5 mm) to 0.40 inch (10 mm). Composites with thicknesses outside this range are contemplated as well.

Resins of the present invention have a viscosity, in some embodiments, that is generally less than 10 Pa-s, desirably less than 2 Pa-s, and preferably less than 1 Pa-s (1000 cP) at 120° C. as measured under shear conditions at a shear rate of about 1 $sec^{-1}$ using an instrument such as a cone-and-plate or parallel-plate viscometer.

Embodiments of the present invention include polybenzoxazines prepared by curing of the benzoxazine resins. Curing is accomplished by heating of the resin, typically in a mold. Curing results in polymerization primarily through opening of the oxazine ring. Curing may result in opening of some or all of the oxazine rings in the material. Curing may be accomplished with or without catalyst and with or without initiator. One suitable catalyst is lithium iodide, which is effective in the range of 1 to 3 mol %. Post-curing of parts may or may not be beneficial. Exemplary embodiments have been post-cured in a convection oven for 2.5 hours at approximately 120° C. One potential benefit of a post cure step is an increase in the glass transition temperature of the polymer matrix.

When a resin is cured to form a matrix in composites with polyethylene fiber reinforcement it is important that the cure temperature be less than 130° C., preferably 120° C. or lower. When fabricating composites using polyethylene fibers it is imperative that the processing conditions do not exceed the fibers' short-duration temperature threshold (typically 130° C.). Exceeding this threshold causes disruption of the polyethylene crystalline structure and results in a variety of concomitant detrimental effects. Higher temperatures may cause the fibers to melt. Disruption of the crystalline structure or melting of the fibers dramatically reduces their mechanical properties.

Embodiments of the present invention include resins with unexpectedly low cure temperatures, allowing cure at temperatures much lower than other benzoxazines. Particularly advantageous are embodiments of the present invention that may be cured at temperatures low enough to avoid detrimental effects to polyethylene fiber reinforcements. Curing of the resins of the present invention may be conducted in the bulk rather than in solution. The exemplary resin embodiment 3OBPH-dac12 may be successfully cured using a cure schedule with a maximum temperature of 120° C. for approximately 2 hours. Low temperature cure is a major advantage over alternative resins which must be cured at higher temperatures. For example, other benzoxazines must typically be cured in the temperature range of 160° C. to 220° C. [H. Ishida and T. Agag, Eds. Handbook of Benzoxazine Resins, Elsevier, 2011, p. 6], which would result in melting of polyethylene fibers and loss of their reinforcing effect.

Commercial benzoxazine resins, available for example from Huntsman Advanced Materials and Henkel, require cure schedules that generally include a maximum temperature in the range of about 177° C. to about 232° C. Total cumulative cure time typically ranges from about 2 hours to about 9 hours. Commercial catalysts, for example from Huntsman Advanced Materials such as "Accelerator DT310," are available to lower the cure temperature of benzoxazine resins. The product literature includes descriptions of this catalyst such as "Allows curing at lower temperatures" and "Can be used to lower the temperature of cure." This product literature shows that this catalyst can reduce cure temperatures to the range of about 136° C. to 186° C. U.S. Pat. No. 9,416,302 describes analysis of the cure of Araldite® 35600, a bisphenol A-benzoxazine from Huntsman Advanced Materials [col, 21:59-22:46]. Analysis by differential scanning calorimetry (DSC) showed a cure onset temperature of about 140° C. and a cure exotherm peak with a maximum at approximately 211° C. Numerous similar formulations were also analyzed by DSC and found to have cure onset temperatures in the range of 168° C. to 229° C. [col. 23:20-24:48].

U.S. Pat. No. 6,376,080 entitled "Method for Preparing Polybenzoxazine" describes the curing of a bisphenol-N-aniline benzoxazine at 175° C. U.S. Patent Application Publication 2012/0172569 entitled "Thermosetting Resin Having Benzoxazine Ring and Method for Producing the Same" describes the curing of several benzoxazine resins. In each case the cure cycle included steps with curing at 150° C., 180° C., 200° C., 220° C., 240° C. and 260° C. Curing conditions for three different benzoxazine monomers are presented by Zuniga et. al. in "Advanced and Emerging Polybenzoxazine Science and Technology" [H. Ishida and P. Froimowicz, eds., Elsevier (2017), p. 430]. Three different cure cycles are given, with maximum cure temperatures of 260° C., 190° C., and 260° C.

U.S. Pat. No. 8,318,878 entitled "Benzoxazine-Containing Formulations Polymerizable/Curable at Low Temperature" describes the curing of benzoxazines in the presence of a fluoro-organic catalyst that includes a metal capable of forming metal:ligand complexes, such as manganese, iron, or cobalt. This patent shows an example of cure of the benzoxazine of p-cresol and aniline in the presence of the catalyst at 150° C. [col. 13:49-14:46]. It also shows examples of the cure of the benzoxazine of p-cresol and methylamine in the presence of the catalyst at 100° C. and 120° C. [col. 14:49-15:35]. However, the low temperature cure was achieved by means of the presence of the specific catalyst, rather than by means of the unique molecular structure of the benzoxazine as is the case in the present invention. That said, the resins or polymers of the invention are cured at a maximum temperature of 120° C. or lower and in the absence of a fluoro-organic catalyst as described in the above-noted patent.

U.S. Pat. No. 9,416,302 entitled "Polybenzoxazine Composition" describes analysis of the cure of a benzoxazine prepared from diphenyl-Jeffamine® D400 benzoxazine [col. 21:62-22:60]. Analysis by DSC showed a cure onset temperature of about 130° C. and a cure exotherm peak with dual maximums at approximately 170° C. and 225° C. This patent further describes curing of p-cresyl benzoxazine of aniline utilizing cure cycles that included temperatures of 170° C. and 200° C. [col 23:49-59].

Yet another aspect of embodiments of the present invention relates to polymer matrix composites prepared using the benzoxazine resins. Composites may include a variety of reinforcements known in the art. Reinforcements may be added to improve mechanical properties and/or to achieve other property improvements. Reinforcing fibers may or may not be continuous fibers. A continuous fiber composite is generally a composite in which the fibers are long compared to the smallest overall dimension of the composite part, generally its thickness. Continuous fiber reinforcement is preferred for even more advantageous mechanical properties. One preferred type of fiber reinforcement is carbon fibers. Continuous carbon fibers or carbon fiber fabric reinforcements are particularly effective for improving mechanical properties.

Ultra-high molecular weight polyethylene (UHMWPE) fibers are an especially preferred reinforcing fiber for radiation shielding applications due to their high hydrogen content. These fibers also possess excellent ballistic impact properties and are used in vehicle armor, body armor, and other ballistic protection applications. Composites prepared with high hydrogen content benzoxazines and UHMWPE reinforcing fibers have both high hydrogen content for shielding against GCR and SEP as well as excellent mechanical properties. These composites provide both shielding and structural functionality for aerospace structures including, but not limited to, spacecraft, rovers, and habitats.

Figure 1:
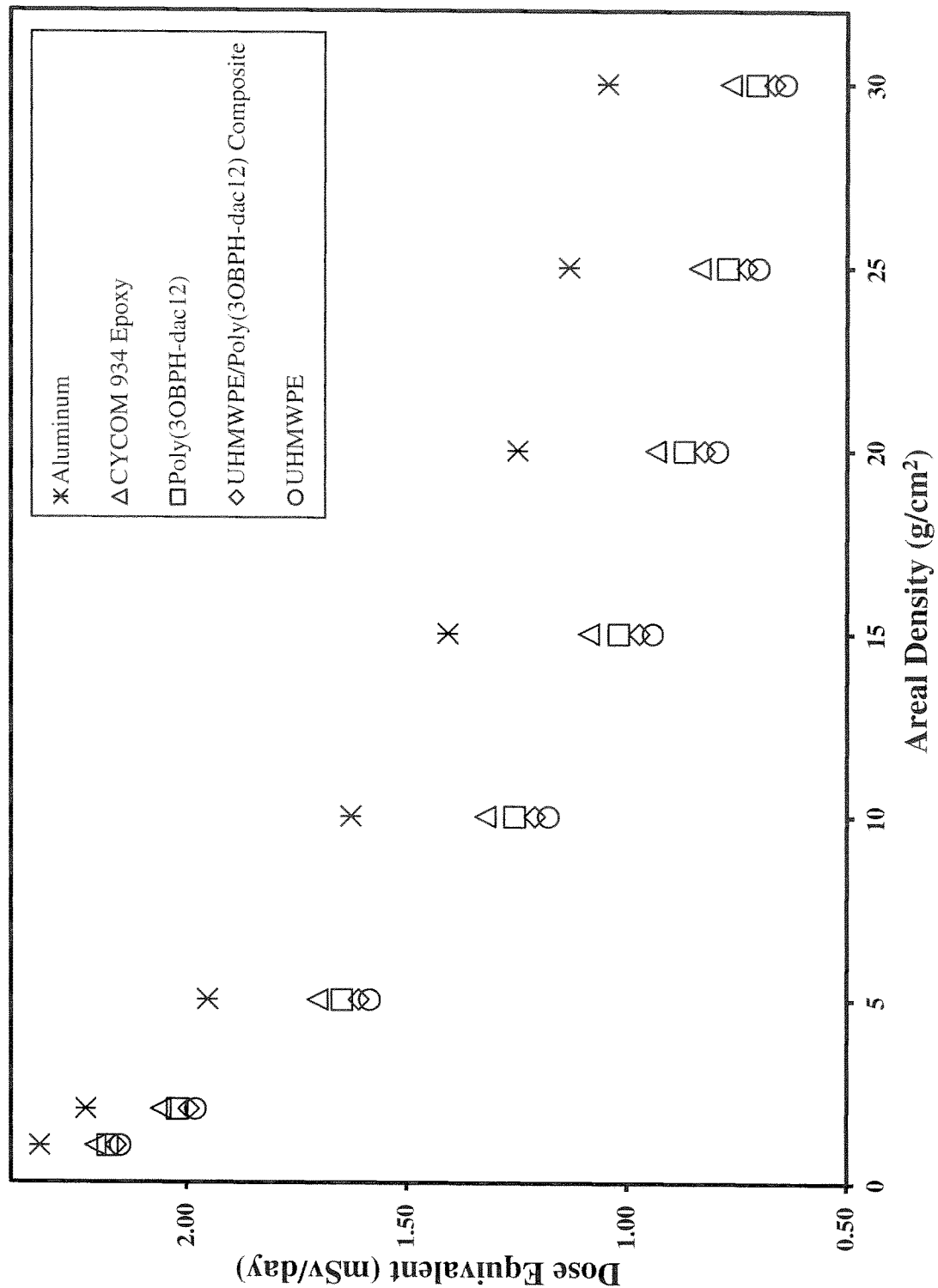
FIG. 1 is a plot of simulated radiation shielding performance results for shielding materials exposed to galactic cosmic rays in a free space environment.
Figure 2:
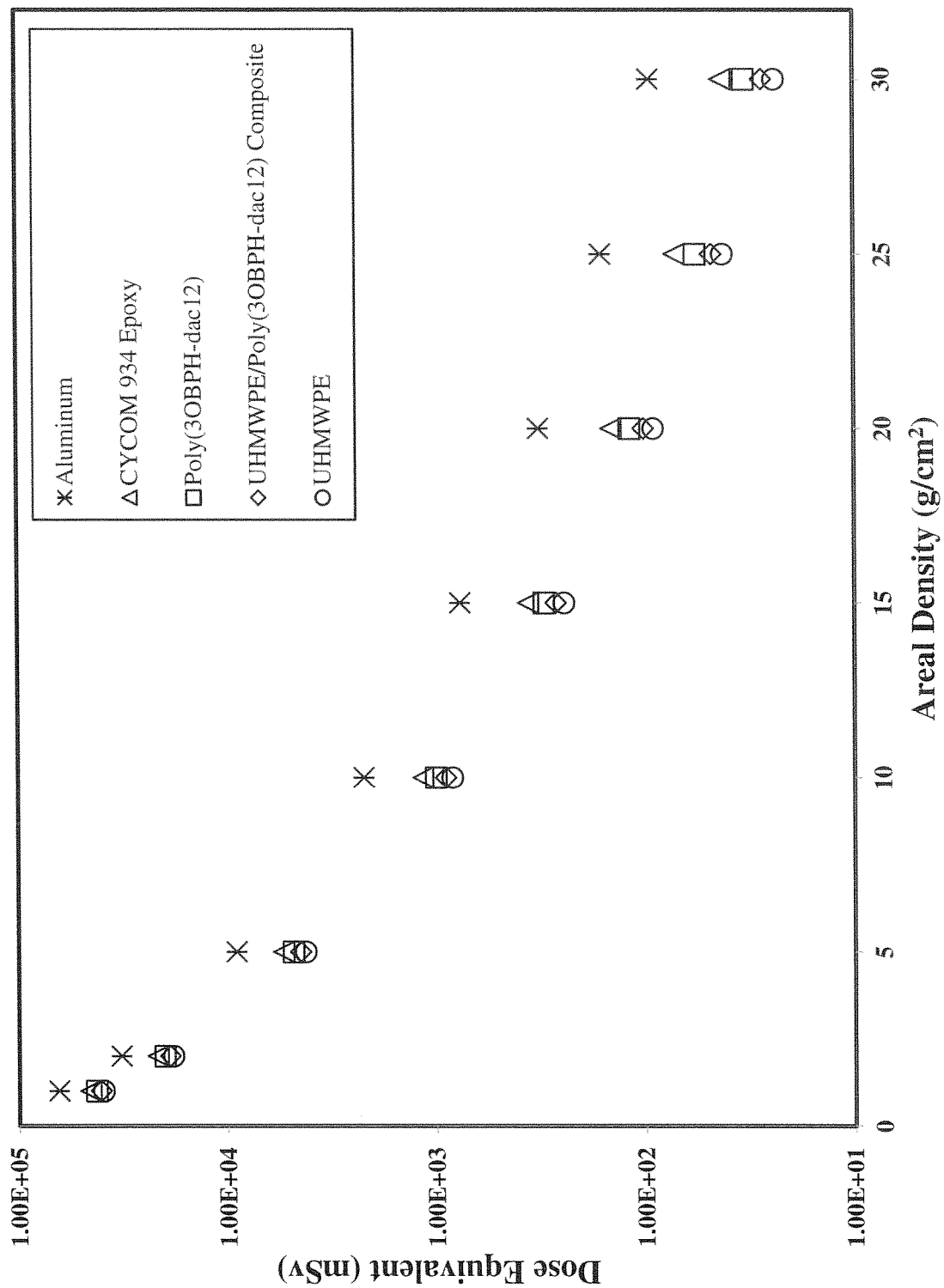
FIG. 2 is a plot of simulated radiation shielding performance results for shielding materials exposed to solar energetic particles in a free space environment.

Embodiments of the present invention have high hydrogen content and thus are very effective for shielding against GCR and SEP. Two such exemplary embodiments are poly (3OBPH-dac12) and a composite comprising a matrix of about 40% by volume of poly(3OBPH-dac12) and about 60% by volume of reinforcing UHMWPE fibers. The shielding effectiveness of materials is often quantified in terms of dose equivalent as a function of areal density (g/cm$^2$) of the material. Computer simulations are available for calculation of radiation shielding effectiveness. Two figures are provided herein that show such calculations over a shield areal density range of 1.0 to 30.0 g/cm$^2$, inclusive. FIG. 1 is a plot of simulated radiation shielding performance results for shielding materials exposed to GCR in a free space environment. FIG. 2 is a plot of simulated radiation shielding performance results for shielding materials exposed to SEP in a free space environment. Shielding performance results are calculated using particle transport algorithms and physics simulations based on HZETRN2005 and NUCFRG2 research codes found in NASA's On-Line Tool for the Assessment of Radiation in Space (OLTARIS). Simulation parameters are shown in the table below and were selected based on their use as cross-program design specifications for natural environments (DSNE) by NASA. All materials were modeled using slab geometry. Using this geometry option, the external environment, or boundary condition, is transported from face to face using a straight-ahead transport with bi-directional or backscattered neutrons.

| Environment | Description | Simulation Parameters |
|---|---|---|
| GCR, Free Space 1 AU | Free space galactic cosmic ray environment at a distance of one astronomical unit (1 AU) from the sun. | Badhwar-O'Neill 2010 GCR model, 1977 solar minimum event |
| SPE, Free Space 1 AU | Free space solar particle event environment at a distance of one astronomical unit (1 AU) from the sun. | August 1972 (King) event |

The simulation results indicate that the shielding performance of poly(3OBPH-dac12) and the UHMWPE/poly (3OBPH-dac12) composite are both superior to aluminum and approach the effectiveness of ultra-high molecular weight polyethylene itself. Ultra-high molecular weight polyethylene sheets are currently used for radiation shielding, however, this material does not have mechanical properties suitable for structural applications. The shielding provided by poly(3OBPH-dac12) and the UHMWPE/poly (3OBPH-dac12) composite is also superior to that provided by Cytec CYCOM® 934 epoxy. The benchmark epoxy material used in simulations was Cytec CYCOM® 934 (formerly Fiberite 934), which is referenced by NASA radiation shielding literature. Composites of the present invention have shielding performance in the GCR free space 1 AU environment at an areal density of 10 g/cm$^2$ of generally less than 1.5, desirably less than 1.4, and preferably less than 1.3 as measured in dose equivalent (mSv/day).

Embodiments of the present invention include composites with boron fiber reinforcement. Space radiation and radiation from nuclear power sources includes neutrons. It is known in the art that materials containing boron are especially effective for shielding against neutrons. Boron fibers also have excellent mechanical properties. Boron fibers are commercially available, for example, from Specialty Materials, Inc. of Lowell, Mass. Boron fibers are typically larger in diameter and stiffer than other continuous reinforcing fibers used with polymer matrices. However, the low viscosity and ease of processability of the benzoxazine resins readily allows for preparation of composites with boron fiber reinforcement. A component with a high hydrogen content polybenzoxazine and boron fiber reinforcement provides shielding against GCR, SEP, and neutrons as well as mechanical properties suitable for structural and semi-structural applications.

Embodiments of the present invention include composites with fibers or fabrics that are electrically conductive. Space radiation includes electrons. It is desirable that shields designed for environments with electron radiation be electrically conductive. Electrically conductive fibers or fabrics can be incorporated into a benzoxazine matrix in order to make the composite electrically conductive and/or to provide a convenient means for grounding the shield. Copper is one example of an electrically conductive material that is commercially available in wire, fiber, and fabric forms. The ease of processability of the benzoxazine resins allows for the preparation of composites with a variety of electrically conductive fibers. A component with a high hydrogen content polybenzoxazine matrix and electrically conductive fibers provides shielding against GCR, SEP, and electrons.

Other embodiments of the present invention comprise composites with multiple different types of fibers. The ease of processability of the benzoxazine resins allows targeted design of a composite structure in a single molded part. For example, composite parts may be molded as a sandwich structure comprised of high hydrogen content polybenzoxazine matrix throughout, UHMWPE fiber fabric reinforcement in the core, and carbon fiber fabric in thin skin layers. In this configuration, the benzoxazine matrix and the UHMWPE fibers provide high hydrogen content for radiation shielding. The UHMWPE fiber fabric and carbon fiber fabric provide continuous fiber reinforcement for excellent mechanical properties. The mechanical properties of carbon fibers are typically superior to those of the UHMWPE fibers. Thus, carbon fibers may be placed in thin skin layers to maximize improvement of flexural properties. Other composite structures with advantageous properties are also possible.

Composites that include two, three, or more different types of fibers may be prepared. The different fiber types may be placed in targeted locations of the composite in order to achieve specific benefits. For example, very stiff or strong fibers may be placed in skin layers. Also, fibers of different types may be placed in different locations to provide additional shielding or additional mechanical strength in those locations. The unique advantages of embodiments of the present invention allow such structured composites to be molded as a single part in a single molding step. For example, a shielding component of the present invention comprising a high hydrogen content polybenzoxazine matrix, UHMWPE reinforcing fibers, boron reinforcing fibers, and copper fibers provides shielding against GCR, SEP, neutrons, and electrons and has mechanical properties suitable for use as a structural element in a spacecraft.

Embodiments of the present invention provide a superior combination of properties that is not achievable using current materials. Materials with high hydrogen content and high specific strength are particularly advantageous for use in structural spacecraft components that also provide shielding. A key characteristic of a structural material is its specific tensile strength, which can be quantified in terms of MPa/ $(g/cm^3)$; higher specific tensile strengths are preferred. The shielding effectiveness of a material can be calculated using computer models, as described above, and quantified in terms of equivalent radiation dose (mSv/day) for a given areal density; lower radiation doses are preferred. FIG. 3 provides a plot of specific strength versus radiation dose for a composite comprising a matrix of about 40% by volume of poly(3OBPH-dac12) and about 60% by volume of reinforcing UHMWPE fibers as well as alternative commercial materials. FIG. 3 shows all materials at an areal density of 15 $g/cm^2$. Aluminum is widely used as a structural material for spacecraft, especially for high specific strength. UHMWPE is used for shielding against GCR due to its high hydrogen content. Cytec CYCOM® 934 is an aerospace-qualified epoxy that is referenced by NASA radiation shielding literature. T300/CYCOM 934 is a composite material comprised of Cytec CYCOM® 934 epoxy and T300 carbon fiber reinforcement. The plot demonstrates that the UHMWPE fiber/poly(3OBPH-dac12) composite provides superior multifunctional performance compared to the alternative materials—it possesses a combination of both high specific strength and very good radiation shielding performance approaching that of UHMWPE.

Embodiments of the present invention include structured shielding systems designed for shielding against a broad range of radiation types. Space missions involve exposure to a wide variety of radiation including GCR, SEP, neutrons and electrons. Shielding in such extreme environments may be accomplished by embodiments of the present invention.

For example, such shielding may be provided by "graded-Z" shields that contain materials with a large range of atomic numbers ("Z" values) that are arranged in a layered configuration from high-Z to low-Z. Typical graded-Z shield designs contain a high-Z metal outer layer such as tungsten or tantalum; one or more mid-Z metal layers such as aluminum, copper, or tin; and a low-Z inner layer such as polyethylene. Embodiments of the present invention are suitable for inclusion in a layered graded-Z shielding system. The high hydrogen content polybenzoxazine and/or UHMWPE/polybenzoxazine composite may serve as the low-Z inner layer in such a system. Use of a UHMWPE/polybenzoxazine composite instead of a polyethylene sheet significantly improves the mechanical properties of the shield. Boron fibers may be utilized to enhance shielding against neutrons and further improve the mechanical properties. Electrically conducting fibers, such as copper, may be used to enhance shielding against electrons. The use of continuous fiber reinforcement in the high hydrogen content portion of the shield provides superior mechanical properties so that the shielding components can also be used as structural elements. The resulting system provides shielding against a broad range of radiation types in combination with mechanical properties suitable for structural applications.

Various additives and/or modifiers may be included in the present invention. Additives and modifiers may include stabilizers, ultraviolet (UV) stabilizers, antioxidants, scavengers, lubricants, processing aids, antimicrobials, flame retardants, anti-blocking additives, antistatic additives, colorants, whitening agents, coupling agents, and other additives and modifiers known in the art. Fillers and reinforcements may be added. Nano particles may be included.

This invention can be further illustrated by the following examples of embodiments thereof, although it will be understood that these examples are included merely for purposes of illustration and are not intended to limit the scope of the invention unless otherwise specifically indicated.

EXAMPLES

Example 1: Synthesis of 3OBPH-dac12 Benzoxazine

3OBPH-dac12 resin monomer was synthesized using the following procedure. 3-Butoxyphenol (3.32 grams), 1,12-diaminododecane (2.00 grams), and paraformaldehyde (1.26 grams) were added to 50 mL of chloroform in a 100 mL round bottom flask. The solution was slowly heated to 60° C. and stirred for 7 hours to promote reaction; the solvent was refluxed continuously. The solution was first washed three times with 1 normal NaOH(aq) solution (50 mL) and then washed with water (50 mL) three times. The resulting solution was dried under vacuum to obtain 3OBPH-dac12, a yellow-brown waxy liquid (4.52 grams). The resulting product was stored in a freezer at approximately −18° C. The resin was cured by different means, including the means described in examples that follow. The isomer content was evaluated using proton nuclear magnetic resonance spectroscopy (1H NMR) and found to be about 75% of 7-substitution and 25% of 5-substitution. The shear viscosity of the resin was measured and found to be approximately 1 Pa-s (1000 cP) at 120° C. This low viscosity allows it to be processed more easily and using a wide range of processing methods. The gel time of the resin was measured using dynamic mechanical analysis and found to be 50 minutes at an isothermal cure temperature of 100° C.; 25 minutes at 110° C.; and 12 minutes at 120° C.

Example 2: Curing of 3OBPH-dac12

This example describes the cure of approximately 10 grams of neat resin prepared by the method of Example 1. Neat 3OBPH-dac12 resin was removed from a storage jar and added to a silicone mold using a spatula. The mold opening was covered with a lid containing a small vent hole. The mold was placed in a vacuum oven preheated to 60° C. A vacuum of approximately 760 mm of mercury (Hg) was applied and held during the entire cure cycle. The mold was heated at 60° C. for one hour. Oven temperature was then slowly increased to 120° C. over a period of one hour. The temperature was held at 120° C. for two hours. The mold was removed from the oven and allowed to cool at room temperature. The molded part was removed from the mold and found to be a solid polymer, translucent yellow in color, with a density of approximately 1.08 g/cm$^3$. Curing of the resin by opening of the oxazine ring was confirmed using infrared spectroscopy.

Example 3: Curing of 3OBPH-dac12 with Catalyst

This example describes the preparation and cure of approximately 10 grams of catalyst-modified resin. First, approximately 26 grams of acetone was added to an Erlenmeyer flask. 0.07 grams of lithium iodide (LiI) was added to the acetone and mixed until fully dissolved. Approximately 10 grams of neat 3OBPH-dac12 benzoxazine resin was placed into a separate flask. Approximately 40 grams of chloroform was then added to the flask containing the resin. The resin and chloroform solution was mixed vigorously using a magnetic stirring bar for approximately 10 minutes until there were no visible solid particles of resin remaining.

The solution of acetone and LiI was then added to the flask containing the resin and chloroform solution. The resulting solution was mixed vigorously using a magnetic stirring bar for approximately 5 minutes. The solution was poured into a shallow tray and allowed to sit under a fume hood at room temperature for one hour to allow most of the solvent to evaporate. The shallow tray was then placed inside a vacuum oven for solvent removal overnight at 40° C. under vacuum (approximately 760 mm Hg).

The catalyst-modified resin was removed from the pan using a spatula and added to a silicone mold. The mold opening was covered with a lid containing a small vent hole. The mold was placed in a vacuum oven preheated to 60° C. A vacuum of approximately 760 mm Hg was then applied and held during the entire cure cycle. The mold was heated at 60° C. for one hour. Oven temperature was then slowly increased to 120° C. over a period of one hour. The temperature was held at 120° C. for two hours. The mold was removed from the oven and allowed to cool at room temperature. The molded part was removed from the mold and found to be a solid polymer, translucent amber in color, with a density of approximately 1.08 g/cm$^3$.

Example 4: Composite of Poly(3OBPH-dac12) and UHMWPE Fabric

This example describes the fabrication of a composite plate containing four 6.0×6.0 inch plies of ultra-high molecular weight polyethylene (UHMWPE) fabric reinforcement and poly(3OBPH-dac12) polymer. The fabric was purchased from a commercial source and was comprised of plain-woven Honeywell Spectra® 1000 UHMWPE fibers. The fabric technical specification identified the areal density as 88.15 g/m$^2$ and the yarn denier as 215 for both the warp and fill direction. The fabric surface was not modified with any type of treatment. The density of Spectra® 1000 fiber is reported as 0.97 g/cm$^3$ by the manufacturer.

Approximately 10 grams of neat 3OBPH-dac12 resin was applied to the surfaces of the UHMWPE fabric plies using a spatula. Consolidation and cure of the composite were achieved by simultaneously applying vacuum and heat while sealed in a vacuum bagged mold, as illustrated in FIG. 4. A one-sided mold was constructed using a 12.0×12.0×0.38 inch polished aluminum plate 8, vacuum bagging film 1, perforated release film 4, non-perforated release film 7, breather/bleeder cloth 3, vacuum sealing tape 6 and a 6.0×6.0×0.50 inch rubber pressure plate 2 according to the schematic provided in FIG. 4. Plies of UHMWPE fabric containing resin 5 were hand laid into the mold during assembly. Vacuum tubing was connected to the mold using a through-bag vacuum fitting placed below the vacuum bagging film and on top of the breather/bleeder cloth.

The aluminum plate was heated by placing it directly on the surface of a hotplate with a 10.25×10.25 inch ceramic top 9. Composite temperature was monitored using a thermocouple that was placed on the surface of the aluminum plate under a corner of the composite. The cure cycle used is shown graphically in FIG. 5. The temperature shown in FIG. 5 is the target temperature and the actual measured temperature tracked it closely. Full vacuum of approximately 760 mm Hg was applied during the entire cure cycle. The maximum temperature in the cure cycle shown in FIG. 5 is 120° C. This is an unexpectedly low cure temperature for a benzoxazine resin and is low enough to allow for curing of composites incorporating polyethylene fibers without disrupting the fiber microstructure.

After completion of the cure cycle, the aluminum plate was removed from the hotplate, placed on a cooling rack, and allowed to cool at room temperature. Vacuum continued to be applied during cooling to prevent warping. The composite was allowed to cool to approximately 60° C. prior to removal from the mold.

The composite plate was inspected after removal from the mold. It appeared to be fully cured and showed no signs of defects due to melting of the UHMWPE fibers. The plate was flat with a nominal thickness of 0.635 mm. Specimens for density and tensile testing were cut from the composite plate using a laser cutter. Average composite density was measured to be 0.94 g/cm$^3$. Average tensile strength and modulus were measured to be 478 MPa and 16.4 GPa, respectively, based on test results from five specimens.

Example 5: Composite of Poly(3OBPH-dac12) w/Catalyst and UHMWPE Fabric

This example describes the fabrication of a composite plate containing four 6.0×6.0 inch plies of UHMWPE fabric reinforcement and catalyst-modified poly(3OBPH-dac12) resin. Approximately 10 grams of catalyst-modified 3OBPH-dac12 resin was prepared one day prior to the composite fabrication trial in accordance with the procedure identified in Example 3. Resin was applied to the surfaces of the UHMWPE fabric plies using a spatula. The same plain-woven Spectra 1000 UHMWPE fabric described previously in Example 4 was used in this example as well.

Consolidation and cure of the composite were achieved by simultaneously applying vacuum and heat while sealed in a vacuum bagged mold. As shown in FIG. 4, a one-sided mold was constructed using a 12.0×12.0×0.38 inch polished aluminum plate 8, vacuum bagging film 1, perforated release film 4, non-perforated release film 7, breather/bleeder cloth 3, vacuum sealing tape 6 and a 6.0×6.0×0.50 inch rubber pressure plate 2 according to the schematic provided in FIG. 4. Plies of UHMWPE fabric containing resin 5 were hand laid into the mold during assembly. Vacuum tubing was connected to the mold using a through-bag vacuum fitting as described previously in Example 4.

The aluminum plate was heated by placing it directly on the surface of a digital hotplate with a 10.25×10.25 inch ceramic top 9. The cure cycle used is shown graphically in FIG. 5. Full vacuum of approximately 760 mm Hg was applied during the entire cure cycle.

After completion of the cure cycle, the aluminum plate was removed from the hotplate, placed on a cooling rack, and allowed to cool at room temperature. Vacuum pressure continued to be applied during cooling to prevent warping. The composite was allowed to cool to approximately 60° C. prior to removal from the mold.

The composite plate was inspected after removal from the mold. It appeared to be fully cured and showed no signs of defects due to melting of the UHMWPE fibers. The plate was flat with a nominal thickness of 0.635 mm. Specimens for density and tensile testing were cut from the composite plate using an 80 Watt laser cutter. Average composite density was measured to be 0.95 g/cm$^3$. Average tensile strength and modulus were measured to be 421 MPa and 15.7 GPa, respectively, based on test results from six specimens.

Example 6: Benzoxazine Resins Based on Various Diamines

The preparation of 3OBPH-dac12 was described in Example 1 through the use of 1,12-diaminododecane (CAS 2783-17-7). Similarly benzoxazine resins may be prepared through the use of other diamines. Use of alternative linear diamines results in the preparation of benzoxazine resins as indicated in the following table. The estimated hydrogen atom concentration of each of the resulting benzoxazine resins, assuming a cured resin density of 1.07 g/cm$^3$, is also provided in the table.

| Diamine | CAS# | Benzoxazine Formula (when reacted with 3-butoxy phenol) | Hydrogen Atom Concentration (at 1.07 g/cm$^3$ cured resin density) (H atoms × 10$^{22}$/cm$^3$) |
|---|---|---|---|
| 1,12-diaminododecane | 2783-17-7 | $C_{36}H_{56}N_2O_4$ | 6.21 |
| 1,8-diaminooctane | 373-44-4 | $C_{32}H_{48}N_2O_4$ | 5.89 |
| 1,10-diaminodecane | 646-25-3 | $C_{34}H_{52}N_2O_4$ | 6.06 |
| 1,14-diaminotetradecane | 7735-02-6 | $C_{38}H_{60}N_2O_4$ | 6.35 |
| 1,16-diaminohexadecane | 929-94-2 | $C_{40}H_{64}N_2O_4$ | 6.47 |
| 1,18-diaminooctadecane | 10341-25-0 | $C_{42}H_{68}N_2O_4$ | 6.59 |

Example 7: Benzoxazine Resins Based on Various Phenols

The preparation of 3OBPH-dac12 was described in Example 1 through the use of 3-butoxy phenol) (CAS 18979-72-1). Similarly, benzoxazine resins may be prepared through the use of other phenols. Use of alternative phenols results in the preparation of benzoxazine resins as indicated in the following table. The estimated hydrogen atom concentration of each of the resulting benzoxazine resins, assuming a resin density of 1.07 g/cm$^3$, is also provided in the table.

| Phenol | CAS# | Benzoxazine Formula (when reacted with 1,12-dodecane) | Hydrogen Atom Concentration (at 1.07 g/cm$^3$ resin density) (H atoms × 10$^{22}$/cm$^3$) |
|---|---|---|---|
| 3-butoxyphenol | 18979-72-1 | $C_{36}H_{56}N_2O_4$ | 6.21 |
| 3-methoxyphenol | 150-19-6 | $C_{30}H_{44}N_2O_4$ | 5.71 |
| 3-ethoxyphenol | 621-34-1 | $C_{32}H_{48}N_2O_4$ | 5.89 |
| 3-propoxyphenol | 16533-50-9 | $C_{34}H_{52}N_2O_4$ | 6.06 |
| 3-pentyloxyphenol | 18979-73-2 | $C_{38}H_{60}N_2O_4$ | 6.35 |
| 3-hexyloxyphenol | 67089-07-0 | $C_{40}H_{64}N_2O_4$ | 6.47 |
| 3-heptyloxyphenol | 18979-76-5 | $C_{42}H_{68}N_2O_4$ | 6.59 |

Example 8: Shelf Life of 3OBPH-dac12

Several batches of 3OBPH-dac12 resin were prepared by methods similar to that described in Example 1. The resins were stored in a freezer at approximately −18° C. until needed for molding or composite fabrication. After removal from the freezer for usage the resin remained at room temperature for 4 to 6 hours during thawing, handling, and preparation of the composite. The resin was then returned to the freezer. The storage and usage history of each resin batch was tracked. Total storage time prior to complete consumption of the batches ranged from 23 days to 111 days. The number of freeze/thaw cycles for the batches ranged from 5 to 12. For example one batch was held in storage for a total of 111 days and during that time experienced 8 freeze/thaw cycles due to usage. The storage term and repeated thawing and freezing of the resin batches had no noticeable effects on the resin viscosity or processability.

Example 9: Properties of Composites with UHMWPE Fiber Reinforcement

Numerous composites comprising 40% by volume poly (3OBPH-dac12) and 60% by volume UHMWPE fabric were prepared by methods similar to that described in Example 4. These composites were tested to determine their properties. Selected properties are reported in the table below:

| Property | Layup | Test Method | Condition[1] | Value | |
|---|---|---|---|---|---|
| Tensile Strength | $[0]_8$ | ASTM D3039 | CTD | 89.2 ksi | 615.0 MPa |
| | | | RTD | 71.5 ksi | 493.0 MPa |
| | | | ETW | 34.7 ksi | 239.2 MPa |
| Tensile Modulus (Chord, 0.1%-0.3%) | $[0]_8$ | ASTM D3039 | CTD | 1930.0 ksi | 13306.8 MPa |
| | | | RTD | 1270.0 ksi | 8756.3 MPa |
| | | | ETW | 407.0 ksi | 2806.2 MPa |
| Tensile Modulus (Initial Tangent) | $[0]_8$ | ASTM D3039 | CTD | 3316.3 ksi | 22864.9 MPa |
| | | | RTD | 2510.9 ksi | 17311.9 MPa |
| | | | ETW | 1070.3 ksi | 7379.5 MPa |
| Poisson's Ratio | $[0]_8$ | ASTM D3039 | CTD | 0.100 | |
| | | | RTD | 0.118 | |
| | | | ETW | 0.116 | |
| Compressive Strength | $[0]_{32}$ | ASTM D6641 | RTD | 4.0 ksi | 27.5 MPa |
| Compressive Modulus | $[0]_{32}$ | ASTM D6641 | RTD | 2820.0 ksi | 19443.2 MPa |
| Flexural Strength | $[0]_{16}$ | ASTM D790 | RTD | 9.2 ksi | 63.1 MPa |
| Flexural Modulus | $[0]_{16}$ | ASTM D790 | RTD | 1130.9 ksi | 7796.9 MPa |
| Short Beam Strength | $[0]_{32}$ | ASTM D2344 | RTD | 0.8 ksi | 5.5 MPa |
| In-Plane Shear Strength | $[45/-45]_{2S}$ | ASTM D3518 | RTD | 1.3 ksi | 9.0 MPa |
| In-Plane Shear Modulus | $[45/-45]_{2S}$ | ASTM D3518 | RTD | 94.7 ksi | 652.9 MPa |

[1]CTD = cold temperature, dry (−50° C.);
RTD = room temperature, dry (23° C.);
ETW = elevated temperature, wet (80° C., 85% RH)

Example 10: Composites with Multiple Types of Fibrous Reinforcement

Composite plates were prepared with poly(3OBPH-dac12) matrix throughout and containing skin layers reinforced with carbon fiber fabric and a core reinforced with UHMWPE fiber fabric. The carbon fiber used was plain weave carbon fiber fabric (Hexcel HexTow® AS4, 3K filament count per tow). The composite plates were prepared by a method similar to that described in Example 4. However, the top and bottom skin layers were formed using a single ply of carbon fiber fabric while the core was formed using plies of UHMWPE fabric. Samples for tensile testing had two carbon fiber plies (one on each side for the skins) and six UHMWPE fiber plies for the core, resulting in a plate 0.06 inch thick. Samples for flexural testing had two carbon fiber plies (one on each side for the skins) and fourteen UHMWPE fiber plies for the core, resulting in a plate 0.12 inch thick. Test specimens were cut using a waterjet cutter and tested for tensile and flexural properties. Selected properties are reported in the table below. Dramatic increases in the tensile modulus, flexural strength, and flexural modulus were achieved through addition of the carbon fiber skins.

Example 11: Synthesis of 3OMPH-dac2 and 3OMPH-dac4

The resin 3OMPH-dac2 was prepared using 3-methoxyphenol, formalin, and 1,2-diaminoethane. The resin 3OMPH-dac4 was prepared similarly but using 1,4-diaminobutane. The phenol, corresponding diamine, and formalin were mixed in nearly stoichiometric amounts with slight excess formaldehyde (mol ratio 2/1/4.2) in a single neck reaction flask. Five milliliters of chloroform per gram of reactants were added to the flask. The reaction mixture was refluxed with stirring at room temperature for 4 hours. The crude reaction products were washed three times with 1 normal NaOH solution and rinsed with distilled water three times. The products were dried over magnesium sulfate anhydrous overnight and filtered to remove the salt. The products were then precipitated by rinsing with hexane. The purified benzoxazine monomer was dried under vacuum for over 48 hours to obtain the products as pale yellow waxes. The yield for the 3OMPH-dac2 product was 67% and the yield for the 3OMPH-dac4 product was 65%.

| Property | Test Method | UHMWPE Fiber/poly(3OBPH-dac12) Composite | UHMWPE Fiber/poly(3OBPH-dac12) Composite w/ Carbon Fiber Skin Layers | Percent Change |
|---|---|---|---|---|
| Tensile Modulus (Chord, 0.1% to 0.3% Strain), 0° | ASTM D3039 | 1270.0 ksi (8756.3 MPa) | 3124.4 ksi (21541.9 MPa) | +146.0% |
| Tensile Modulus (Initial Tangent), 0° | ASTM D3039 | 2510.9 ksi (17311.9 MPa) | 4799.0 ksi (33087.7 MPa) | +91.1% |
| Flexural Strength | ASTM D790 | 9.2 ksi (63.1 MPa) | 17.5 ksi (120.4 MPa) | +90.2% |
| Flexural Modulus | ASTM D790 | 1130.9 ksi (7796.9 MPa) | 3700.3 ksi (25512.5 MPa) | +227.2% |

Example 12: Synthesis of 3OMPH-dac6, 3OMPH-dac8, and 3OMPH-dac12

The resin 3OMPH-dac6 was prepared using 3-methoxyphenol, 1,6-diaminohexane, and paraformaldehyde. The resins 3OMPH-dac8 and 3OMPH-dac12 were prepared similarly but using 1,8-diaminooctane and 1,12-diaminododecane, respectively. The phenol, diamine, and paraformaldehyde were mixed in nearly stoichiometric amounts with slight excess of formaldehyde (2/1/4.2). Five milliliters of chloroform per gram of reactant were added to the round bottom flask. The solution was stirred at 60° C. for 7 hours. The reaction product was washed with 1 normal NaOH solution three times and distilled water three times. The product was dried over magnesium sulfate anhydrous overnight. The solution was filtered to remove the salt. After evaporating the solvent, the product was dried in a vacuum oven to obtain a pale yellow wax. The reaction yield was 69% for 3OMPH-dac6 and 3OMPH-dac8; and was 71% for 3OMPH-dac12.

For the avoidance of doubt, it is noted that the invention relates to all possible combinations of features described herein, preferred in particular are those combinations of features that are present in the claims. It will therefore be appreciated that all combinations of features relating to the composition according to the invention; all combinations of features relating to the process according to the invention and all combinations of features relating to the composition and process according to the invention are described herein.

It is further noted that the term 'comprising' does not exclude the presence of other elements. However, it is also to be understood that a description of a product comprising certain components also discloses a product consisting of these components. Similarly, it is also to be understood that a description on a process comprising certain steps also discloses a process consisting of these steps.

The invention has been described in detail with particular reference to the preferred embodiments thereof, but it will be understood that variations and modifications can be effected within the spirit and scope of the invention.

What is claimed is:

1. A benzoxazine resin of the chemical structure:

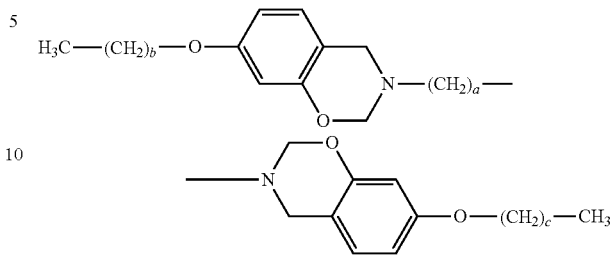

wherein $2 \leq a \leq 18$, $0 \leq b \leq 6$, and $0 \leq c \leq 6$.

2. A polybenzoxazine formed by polymerization of the benzoxazine of claim 1.

3. The polybenzoxazine according to claim 2, formed by polymerization using a cure cycle for which a maximum temperature does not exceed about 120° C.

4. A polybenzoxazine formed by polymerization of the benzoxazine of claim 1, wherein $6 \leq a \leq 14$, $2 \leq b \leq 4$, and $2 \leq c \leq 4$.

5. The polybenzoxazine according to claim 4, formed by polymerization using a cure cycle for which a maximum temperature does not exceed about 120° C.

6. The benzoxazine resin of claim 1, wherein c is equal to b.

7. The benzoxazine resin according to claim 6, wherein $6 \leq a \leq 18$ and $1 \leq b \leq 6$.

8. A polybenzoxazine formed by cure of the benzoxazine of claim 6.

9. The polybenzoxazine according to claim 8, formed by polymerization using a cure cycle for which a maximum temperature does not exceed about 120° C.

10. The polybenzoxazine according to claim 8, $6 \leq a \leq 14$ and $2 \leq b \leq 4$.

11. The polybenzoxazine according to claim 10, formed by polymerization using a cure cycle for which a maximum temperature does not exceed about 120° C.

12. The polybenzoxazine according to claim 8, wherein a=12 and b=3.

13. A material, comprising:
   a) 1 to 99% by weight of a polybenzoxazine formed by cure of a benzoxazine resin of the chemical structure:

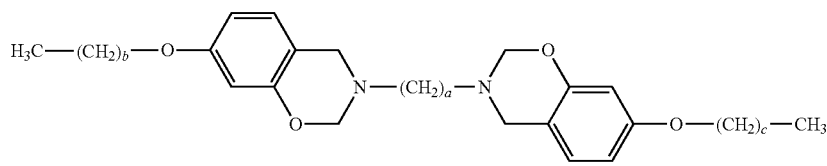

wherein $2 \leq a \leq 18$, $0 \leq b \leq 6$, and $0 \leq c \leq 6$; and
   b) 99% to 1% by weight of polyethylene.

14. The material according to claim 13, wherein the polyethylene comprises one or more of a high-density polyethylene and an ultra-high molecular weight polyethylene.

15. The material according to claim 14, wherein $6 \leq a \leq 14$, $2 \leq b \leq 4$, and $2 \leq c \leq 4$.

16. The material according to claim 15, wherein $a=12$ and $b=c=3$.

17. A material, comprising:
a) 5 to 95% by volume of a polybenzoxazine formed by cure of a benzoxazine resin of the chemical structure:

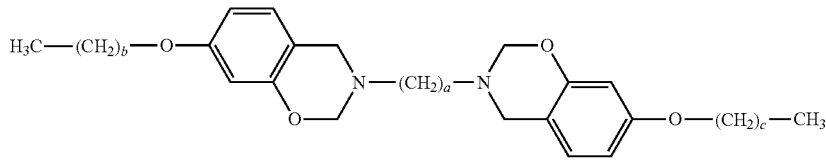

wherein $6 \leq a \leq 18$, $1 \leq b \leq 6$, and $1 \leq c \leq 6$; and
b) 95% to 5% by volume of fibrous reinforcement.

18. The material according to claim 17, wherein the fibrous reinforcement comprises continuous fiber or woven continuous fiber.

19. The material according to claim 18, wherein the fibrous reinforcement comprises one or more of a polyethylene fiber, carbon fiber, and boron fiber.

20. The material according to claim 17, wherein $6 \leq a \leq 14$, $2 \leq b \leq 4$, and $2 \leq c \leq 4$.

21. The material according to claim 20, wherein $a=12$ and $b=c=3$.

22. The material according to claim 17, wherein the material comprises:
a) 30% to 95% by volume of the polybenzoxazine, wherein $a=12$ and $b=c=3$, and b) 5% to 70% by volume of the fibrous reinforcement, and wherein the fibrous reinforcement is woven high density polyethylene fiber.

23. A molded object comprising the material of claim 22.

24. A material, comprising:
a) 5 to 95% by volume of a polybenzoxazine formed by cure of a benzoxazine resin of the chemical structure:

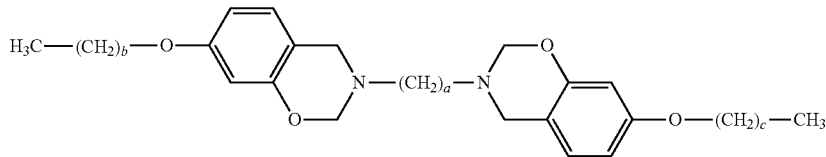

wherein $6 \leq a \leq 18$, $1 \leq b \leq 6$, and $1 \leq c \leq -6$; and
b) 95% to 5% by volume of a fibrous electrical conductor.

25. The material according to claim 24, wherein the fibrous electrical conductor comprises continuous fiber or woven continuous fiber.

26. The material of claim 25, wherein the fibrous electrical conductor comprises copper.

27. The material according to claim 24 wherein $6 \leq a \leq 14$, $2 \leq b \leq 4$, and $2 \leq c \leq 4$.

28. The material according to claim 27 wherein $a=12$ and $b=c=3$.

* * * * *